United States Patent
Dwyer et al.

(10) Patent No.: US 10,036,765 B2
(45) Date of Patent: Jul. 31, 2018

(54) REDUCING HYSTERESIS EFFECTS IN AN ACCELEROMETER

(71) Applicant: Honeywell International Inc., Morristown, NJ (US)

(72) Inventors: Paul W. Dwyer, Seattle, WA (US); John Stanley Starzynski, North Bend, WA (US)

(73) Assignee: Honeywell International Inc., Morris Plains, NJ (US)

( * ) Notice: Subject to any disclaimer, the term of this patent is extended or adjusted under 35 U.S.C. 154(b) by 304 days.

(21) Appl. No.: 14/796,945

(22) Filed: Jul. 10, 2015

(65) Prior Publication Data
US 2017/0010297 A1    Jan. 12, 2017

(51) Int. Cl.
*G01P 15/18*    (2013.01)
*G01P 15/125*   (2006.01)
*G01P 15/13*    (2006.01)
*G01P 15/08*    (2006.01)

(52) U.S. Cl.
CPC .......... *G01P 15/125* (2013.01); *G01P 15/132* (2013.01); *B81B 2201/0235* (2013.01); *G01P 15/0802* (2013.01); *G01P 15/18* (2013.01); *G01P 2015/0857* (2013.01)

(58) Field of Classification Search
CPC .................................................... G01P 15/125
USPC ...................................................... 73/514.32
See application file for complete search history.

(56) References Cited

U.S. PATENT DOCUMENTS

| | | | | |
|---|---|---|---|---|
| 3,702,073 A | * | 11/1972 | Jacobs | G01P 15/132 |
| | | | | 73/514.23 |
| 3,751,292 A | * | 8/1973 | Kongable | H01L 21/00 |
| | | | | 205/186 |
| 4,202,089 A | * | 5/1980 | Ljung | B22D 11/06 |
| | | | | 164/463 |

(Continued)

FOREIGN PATENT DOCUMENTS

CN    102298074 A    12/2011
JP    2002168878 A    6/2002

(Continued)

OTHER PUBLICATIONS

European Search Report EP 16169001, European Patent Office, dated Sep. 7, 2016, 6 pgs.*

(Continued)

*Primary Examiner* — Clayton E Laballe
*Assistant Examiner* — Kevin Butler
(74) *Attorney, Agent, or Firm* — Shumaker & Sieffert, P.A.

(57) ABSTRACT

In some examples, the disclosure describes an accelerometer having improved hysteresis effects, the accelerometer including a proof mass assembly including a proof mass, a support structure, and a flexure flexibly connecting the proof mass to the support structure to allow the proof mass to move about the plane defined by the support structure. Some examples may include at least one thin film lead including an electrically conductive material on the flexure, where the at least one thin film lead provides an electrical connection between an electrical component on the support structure and an electrical component on the proof mass, and where the at least one thin film lead comprises at least one of a yield strength greater than pure gold or a thermal expansion coefficient less than pure gold.

20 Claims, 4 Drawing Sheets

(56) References Cited

U.S. PATENT DOCUMENTS

| | | | | |
|---|---|---|---|---|
| 4,250,757 A * | 2/1981 | Hanson | ............... | G01D 5/24 |
| | | | | 73/514.23 |
| 4,269,072 A * | 5/1981 | Duncan | ............... | F16C 11/12 |
| | | | | 29/434 |
| 4,398,417 A * | 8/1983 | Shutt | ............... | G01P 15/125 |
| | | | | 73/497 |
| 4,922,159 A * | 5/1990 | Phillips | ............... | B64G 1/22 |
| | | | | 244/164 |
| 5,292,569 A * | 3/1994 | Barry | ............... | G01P 1/00 |
| | | | | 428/66.6 |
| 5,317,919 A * | 6/1994 | Awtrey | ............... | G01D 5/2417 |
| | | | | 29/25.41 |
| 5,458,000 A * | 10/1995 | Burns | ............... | G01D 3/0365 |
| | | | | 73/497 |
| 5,600,067 A * | 2/1997 | Rupnick | ............... | G01P 1/006 |
| | | | | 73/514.23 |
| 5,604,314 A * | 2/1997 | Grahn | ............... | G01B 17/04 |
| | | | | 73/628 |
| 5,881,598 A * | 3/1999 | Sapuppo | ............... | G01C 19/06 |
| | | | | 74/5 F |
| 5,952,575 A * | 9/1999 | Foote | ............... | G01P 15/132 |
| | | | | 73/514.21 |
| 5,959,207 A * | 9/1999 | Letrondo | ............... | G01P 1/003 |
| | | | | 73/514.13 |
| 6,173,612 B1 * | 1/2001 | Golecki | ............... | G01L 1/183 |
| | | | | 73/514.29 |
| 6,629,462 B2 * | 10/2003 | Otsuchi | ............... | G01P 15/0922 |
| | | | | 310/331 |
| 7,397,165 B1 * | 7/2008 | Kosinski | ............... | H03H 9/0585 |
| | | | | 310/313 R |
| 7,443,509 B1 * | 10/2008 | Burns | ............... | G01L 9/0017 |
| | | | | 356/480 |
| 7,594,438 B2 * | 9/2009 | Ackerley | ............... | G01P 15/08 |
| | | | | 73/514.29 |
| 7,617,729 B2 * | 11/2009 | Axelrod | ............... | G01P 15/125 |
| | | | | 73/514.32 |
| 7,835,055 B2 * | 11/2010 | Desai | ............... | B82Y 20/00 |
| | | | | 359/224.1 |
| 8,485,032 B2 * | 7/2013 | Starzynski | ............... | G01P 15/097 |
| | | | | 73/514.01 |
| 8,528,405 B2 * | 9/2013 | Jenkins | ............... | G01P 15/0802 |
| | | | | 257/E21.214 |
| 8,584,522 B2 * | 11/2013 | Acar | ............... | G01C 19/5712 |
| | | | | 73/504.08 |
| 8,683,862 B2 * | 4/2014 | Wang | ............... | G01C 19/5769 |
| | | | | 331/154 |
| 8,753,468 B2 * | 6/2014 | Caldwell | ............... | B82Y 30/00 |
| | | | | 156/235 |
| 8,824,706 B2 * | 9/2014 | Stephanou | ............... | H04R 1/04 |
| | | | | 381/174 |
| 8,846,183 B2 * | 9/2014 | Unger | ............... | B01L 3/502707 |
| | | | | 137/15.18 |
| 8,887,567 B2 * | 11/2014 | Dwyer | ............... | G01P 15/097 |
| | | | | 73/504.16 |
| 8,939,200 B1 * | 1/2015 | Gilstad | ............... | E21B 28/00 |
| | | | | 166/177.1 |
| 2004/0016981 A1 * | 1/2004 | Yoshida | ............... | G01P 15/0802 |
| | | | | 257/414 |
| 2004/0112135 A1 * | 6/2004 | Letrondo | ............... | G01P 1/003 |
| | | | | 73/514.17 |
| 2012/0107562 A1 * | 5/2012 | Bolotin | ............... | B81C 1/00595 |
| | | | | 428/156 |
| 2013/0018599 A1 * | 1/2013 | Peng | ............... | B82Y 15/00 |
| | | | | 702/30 |
| 2013/0120327 A1 * | 5/2013 | Seo | ............... | G02B 26/001 |
| | | | | 345/204 |
| 2013/0181893 A1 * | 7/2013 | Black | ............... | G02B 26/001 |
| | | | | 345/156 |
| 2013/0206461 A1 * | 8/2013 | Sullivan Malervy | ............... | H01L 21/7685 |
| | | | | 174/257 |
| 2014/0109673 A1 * | 4/2014 | Roehnelt | ............... | G01P 1/006 |
| | | | | 73/514.39 |
| 2014/0197936 A1 * | 7/2014 | Biggs | ............... | G08B 6/00 |
| | | | | 340/407.1 |
| 2014/0292153 A1 * | 10/2014 | Sinha | ............... | H03H 3/04 |
| | | | | 310/346 |
| 2017/0010297 A1 * | 1/2017 | Dwyer | ............... | G01P 15/125 |
| 2017/0115321 A1 * | 4/2017 | Dwyer | ............... | G01P 15/125 |

FOREIGN PATENT DOCUMENTS

| | | | | |
|---|---|---|---|---|
| JP | 2010096509 | * | 4/2010 | ............... G01P 15/13 |
| JP | 2010096509 A | | 4/2010 | |
| WO | 2013063445 A3 | | 5/2013 | |
| WO | 2013192335 A1 | | 12/2013 | |
| WO | 2014209330 A1 | | 12/2014 | |

OTHER PUBLICATIONS

Patent Cooperation Treaty PCT/US2016/031569 International Search Report, dated Jul. 10, 2015, 4 pgs.*

Patent Cooperation Treaty PCT/US2016/031569 Written Opinion of the ISA, dated Jul. 18, 2016, 9 pgs.*

Response to Extended European Report dated Sep. 7, 2016, from counterpart European Application No. 16169001.1, filed on Dec. 12, 2016, 16 pp.

Extended Search Report from counterpart European Application No. 16169001.1, dated Sep. 7, 2016, 6 pp.

International Search Report and Written Opinion of International Application No. PCT/US2016/031569, dated Jul. 18, 2016, 15 pp.

Milaninia, K.M. et al., "All graphene electromechanical switch fabricated by chemical vapor deposition," American Institute of Physics (AIP), Applied Physics Letters 95, No. 18, 2009, retrieved from http://dspace.mit.edu/handle/1721.1/85955 on Feb. 6, 2015, 5 pp.

Schnapp, "Linear-Quadratic Control of a MEMS Micromirror Using Kalman Filtering," Department of the Air Force Air University, Air Force Institute of Technology, Thesis, Dec. 2011, 91 pp.

Shahil, K.M.F et al., "Thermal properties of graphene and multilayer graphene: Applications in thermal interface materials," Solid State Communications, 152, Apr. 12, 2012, pp. 1331-1340.

* cited by examiner

US 10,036,765 B2

REDUCING HYSTERESIS EFFECTS IN AN ACCELEROMETER

STATEMENT REGARDING FEDERALLY SPONSORED RESEARCH OR DEVELOPMENT

This invention was made with Government support under a Classified Government Contract Number. The sponsoring Agency is Classified. The Government has certain rights in the invention.

TECHNICAL FIELD

The disclosure relates to accelerometers.

BACKGROUND

Accelerometers function by detecting the displacement of a proof mass under inertial forces. An accelerometer assembly may, for example, detect the displacement of a proof mass by a capacitive pick-off system. In this example, a capacitor pick-off plate may be deposited on the upper surface of the proof mass, and a similar capacitor pick-off plate may be deposited on the lower surface of the proof mass. The capacitor plates cooperate with the inwardly facing surfaces of upper and lower stators to provide the capacitive pick-off system. Additionally, a force-rebalancing system may be used to detect the displacement of the proof mass, where coil forms with force-rebalancing coils are mounted on either side of the proof mass. The force-rebalancing coils cooperate with permanent magnets in the upper and lower stators and with a suitable feedback circuit to retain the proof mass at a predetermined position (i.e., a null position) with respect to the support structure. Acceleration applied to the accelerometer assembly may be determined based on the change in capacitance with respect to the capacitor pick-off plates or the current increase in the force-rebalancing coils to maintain the proof mass in the null position.

SUMMARY

In some examples, the disclosure describes techniques and devices that may reduce hysteresis effects in an acceleration measurement of an accelerometer (e.g., the inability of the proof mass to return to a null position), by reducing the hysteresis effects observed across flexures supporting the proof mass of an accelerometer. For example, hysteresis in a proof mass assembly may arise due to the thin film leads deposited across the flexures connecting the proof mass to a support structure. The thin film leads provide electrical connections between the capacitor pick-off plates and/or force-rebalance coils and other components or circuitry of the accelerometer. As the temperature of the accelerometer changes, or the flexures flex, differences in the composition of the base material of the flexures and the thin film leads may introduce hysteresis affects into the accelerometer. An accelerometer configured in accordance with the techniques of this disclosure may experience a reduction in such hysteresis effects.

In one example, the disclosure describes an accelerometer including a proof mass assembly including a proof mass, a support structure, and a flexure flexibly connecting the proof mass to the support structure to allow the proof mass to move about the plane defined by the support structure. Such examples may include at least one thin film lead including an electrically conductive material on the flexure, where the at least one thin film lead provides an electrical connection between an electrical component on the support structure and an electrical component on the proof mass, and where the at least one thin film lead comprises at least one of a yield strength greater than pure gold or a thermal expansion coefficient less than pure gold.

In another example, the disclosure describes an accelerometer including an upper and lower stators and a proof mass assembly deposited between the upper and lower stators. In some examples at least one of the upper and lower stators comprises a permanent magnet. In some examples, the proof mass assembly includes a proof mass, a support structure attached to the upper and lower stators, a flexure flexibly connecting the proof mass to the support structure, where the flexure allows the proof mass to move about the plane defined by the support structure, and at least one thin film lead comprising an electrically conductive material on the flexure, where the at least one thin film lead provides an electrical connection between an electrical component on the support structure and an electrical component on the proof mass, and where the at least one thin film lead comprises at least one of a thin layer of gold having a thickness of between about 500 and about 700 angstroms, an alloy of gold, titanium, aluminum-titanium alloy, graphene, molybdenum, tungsten, hafnium, or zirconium.

In another example, the disclosure describes a method including forming a proof mass assembly for an accelerometer, where the proof mass assembly comprises a support structure flexibly connected to a proof mass by at least one flexure. In some examples forming the proof mass assembly includes forming a thin film lead on a surface of the at least one flexure, where the thin film lead comprises at least one of a yield strength greater than pure gold or a thermal expansion coefficient less than pure gold, and where the thin film lead establishes an electrical connection across the flexure between an electrical component on the support structure and an electrical component on the proof mass.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
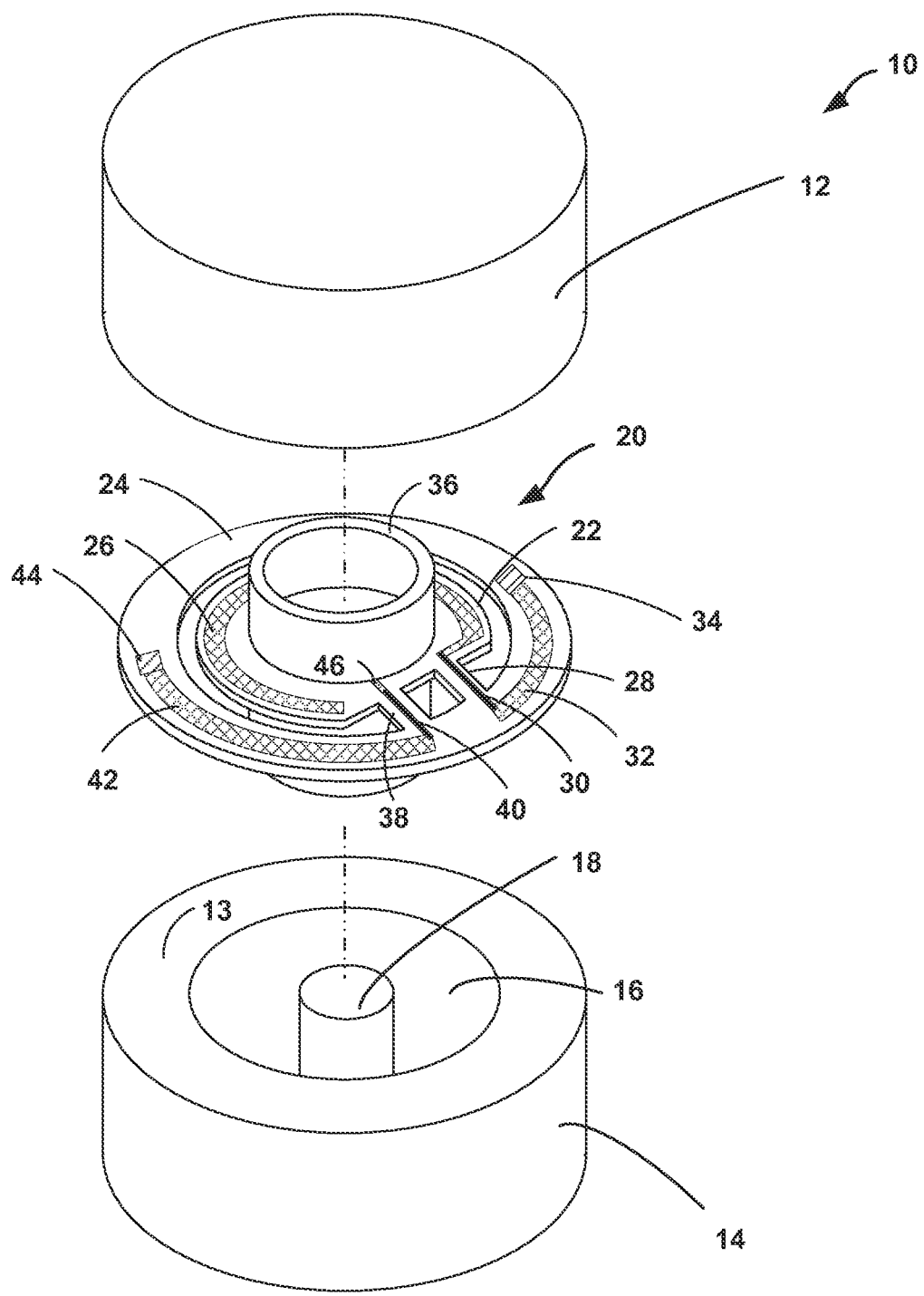
FIG. 1 is a conceptual diagram illustrating an exploded view of an example accelerometer.

In some examples, the present disclosure describes method and devices that may provide reduced hysteresis effects caused by the thin film leads deposited on the flexures holding a proof mass of an accelerometer (e.g., Q-Flex accelerometers made by Honeywell, Inc.).

Navigation systems and positioning systems rely on the accuracy of accelerometers to perform operations. Hysteresis effects in accelerometers (e.g., the inability of the accelerometer to return to a null position) may cause errors to accumulate in the location or positional information of the systems which can compromise the operations of the systems. An accelerometer measures acceleration of the accelerometer itself with respect to an inertial reference frame. An accelerometer with stators (e.g., magnetic structures) above and below the proof mass assembly may form a capacitive pick-off system. For example, as the proof mass is displaced by acceleration of the accelerometer, the change in capacitance of the capacitor pick-off plates on the top and bottom of the proof mass can be used by the accelerometer to determine the displacement of the proof mass. The amount of displacement of the proof mass from a null position may be proportionate to the magnitude of the acceleration incident upon the accelerometer. Additionally or alternatively, an accelerometer with stators above and below a proof mass assembly including force-rebalance coils located on either side of the proof mass may form a force-rebalancing system. For example, the force from the acceleration of the accelerometer, will attempt to displace the proof mass. The current in the force-rebalance coils will be increased by a servo to maintain the null position of the proof mass by driving the differential capacitance from the pick-offs to zero. The current increase in the force-rebalance coils provides the opposite force required for maintaining the null position of the proof mass, and the increase in current will be proportional to the applied acceleration.

The accuracy of some accelerometers may be limited by hysteresis and bias instabilities (e.g., a change in the physical structure of the accelerometer assembly) caused by physical or thermal strains. For example, bias instabilities may be created due to heating and cooling effects that occur during the construction process or operation of the accelerometer. The heating and cooling effects, may introduce stress on the accelerometer assembly due to thermal expansion coefficient (TEC) mismatches between the materials used to construct the accelerometer. The TEC mismatches may alter the position of the proof mass or the capacitive gaps between the proof mass and the upper and lower stators, thereby altering the null-position. For example, the flexure of a proof mass assembly connected to the proof mass may contain one or more conductive thin film leads across the surface of the flexure to establish an electrical connection to the components of the proof mass (e.g., the capacitive pick-off plates and the force-rebalance coils). In some examples, the mismatch between the TECs of the base material of the flexure (e.g., quartz) and the thin film leads may introduce a bias across the flexure that varies depending on the temperature.

Additionally or alternatively, in some examples the materials used to form the thin film leads across the flexure may experience inherent hysteresis effects over time due to the physical structure of the thin film leads. For example, in some examples the thin film leads may be formed across the flexures by depositing a layer of chromium (to promote adhesion) and a layer of gold on the flexure. Over time, the deformation of the flexure resulting from movement of the proof mass may introduce a hysteresis effect in the layer of gold. While not wanting to be bound to a specific scientific theory, it is believed that hysteresis effect in the layer of gold is due in part to the relatively low yield strength of the layer of gold (e.g., about 80 MPa).

During operation, the thermal and/or physical strains exerted on the flexure of the accelerometer may be indistinguishable from an applied acceleration. For example, the introduced stress may cause the proof mass of the accelerometer to be temporarily or permanently displaced, which may be indicative of acceleration even though no acceleration has occurred.

The techniques and devices disclosed herein that may reduce the hysteresis effects (e.g., the inability of an accelerometer to successfully return to a null position) observed across the flexures of the accelerometer, which may result in non-acceleration-dependent changes to the proof mass position and the capacitive gaps. For example, an accelerometer configured in accordance with the techniques of this disclosure may include a thin film lead across the flexure with relatively low TECs, relative high yield strengths compared to gold, and good electrical conductivity. The effects of which may result in reduced hysteresis effects by reducing the thickness of the thin film lead, reducing the TEC mismatches between the thin film lead and base material of the flexure, as well as improving the resistance of the thin film lead to permanent deformation arising during routine operation. Accelerometers may be configured in accordance with techniques of this disclosure to provide for a better accelerometer, which may enable the electronics to better determine the acceleration of the accelerometer.

FIG. 1 is a conceptual diagram illustrating an exploded view of an example accelerometer 10 (e.g., a force rebalance accelerometer) including an upper stator 12, a lower stator 14 (e.g., collectively "upper and lower stators 12 and 14"), and a proof mass assembly 20 disposed between upper and lower stators 12 and 14. In some examples, upper and lower stators 12 and 14 may include inwardly facing surfaces (e.g., inward facing surface 13 of lower stator 14) configured to interact with portions of proof mass assembly 20. Upper and lower stators 12 and 14 may also include a bore 16 along a respective inwardly facing surface with a permanent magnet 18 disposed therein. Accelerometer 10 also includes a proof mass assembly 20, which may be mounted between upper and lower stators 12 and 14. In some examples, proof mass assembly 20 may include a proof mass 22, a support structure 24, and a first flexure 28 and a second flexure 38 (collectively "flexures 28 and 38") flexibly connecting proof mass 22 to support structure 24. Proof mass 22 may include an upper and lower capacitance pick-off plates (only upper capacitance pick-off plate 26 is shown in FIG. 1) and an upper and lower force-rebalance coils (only upper force-rebalance coil 36 is shown in FIG. 1) mounted on the major surfaces of proof mass 22 and configured to interact with upper and lower stators 12 and 14. Support structure 24, may include mounting pads 34, 44, and 49 and one or more electrical traces 32 and 42. Flexures 28 and 38 may contain one or more thin film leads 30 and 40 on an upper or lower surface of the respective flexure of flexures 28 and 38 configured to transmit an electrical signal across the respective flexure.

In some examples, upper and lower stators 12 and 14 may be attached to (e.g., clamped) to opposite sides of proof mass assembly 20 using one or more of the respective mounting pads (e.g., mounting pads 34, 44, and 49). In some examples, upper and lower stators 12 and 14 may include dual metal parts, which include magnets (e.g., permanent magnet 18). In some examples, there may be only a single stator, which may contain a single magnet.

In some examples, upper and lower stators 12 and 14 may be secured to proof mass assembly 20 using a bellyband (not shown). In such examples, the bellyband may be formed from a single metal hoop-like structure that surrounds the exterior of upper and lower stators 12 and 14. The belly band may be fixed to upper and lower stators 12 and 14 using, for example, an epoxy, thereby securing upper and lower stators 12 and 14 after they are clamped to proof mass assembly 20.

Upper and lower stators 12 and 14 may be made from any suitable material including, for example, invar, super invar, or the like. Invar has a relatively low TEC of about 2 parts-per-million (ppm) per degree centigrade (° C.), which may improve compatibility aspects between upper and lower stators 12 and 14 and the base materials used to form proof mass assembly 20 (e.g., quartz which has a TEC of about 0.6 ppm/° C.).

Figure 2:
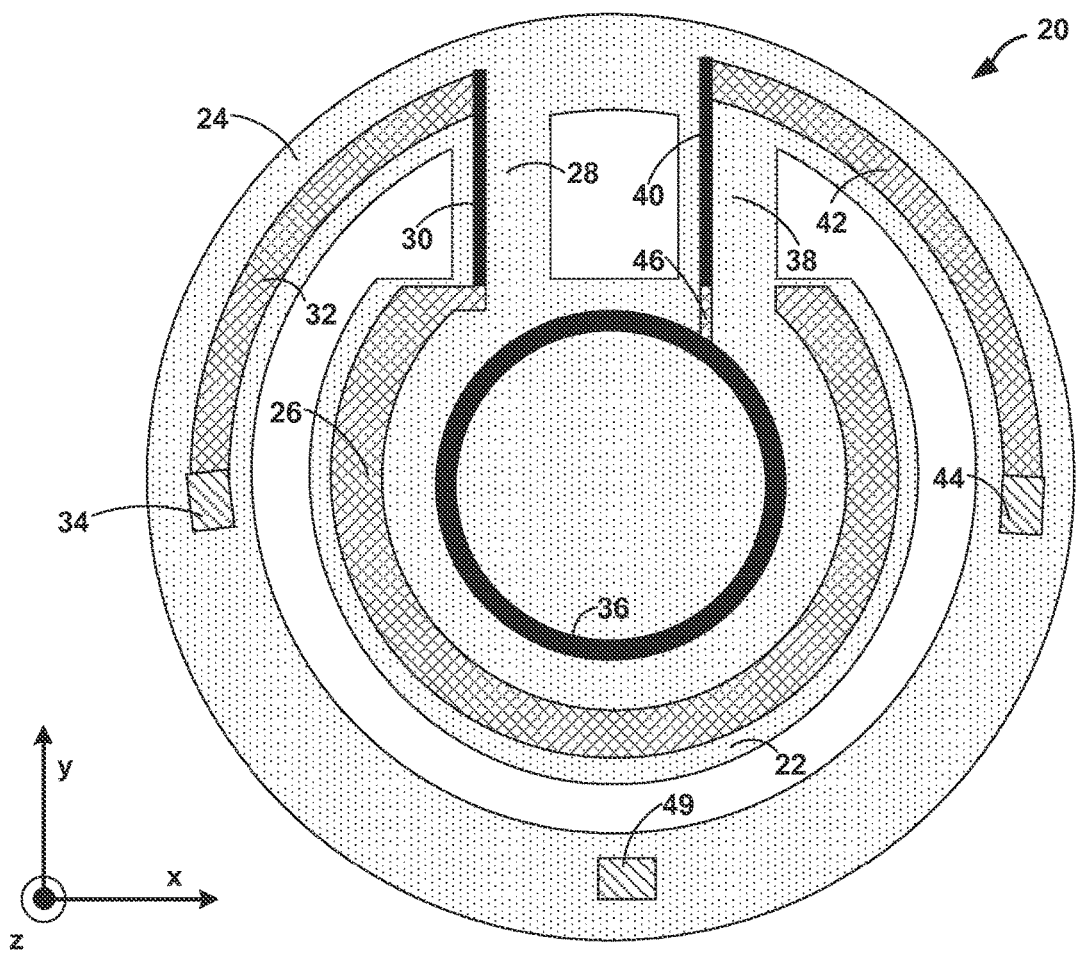
FIG. 2 is a conceptual diagram illustrating a top-view of an example proof mass assembly.

Accelerometer 10 also includes a proof mass assembly 20, which includes proof mass 22 connected to support structure 24 by flexures 28 and 38. Support structure 24 of proof mass assembly 20 may provide structural support for proof mass 22 and help maintain the separation between proof mass 22 and upper and lower stators 12 and 14. In some examples, support structure 24 may define a plane in which proof mass 22 and flexures 28 and 38 are located. For example, FIG. 2 shows a conceptual diagram illustrating a top-view of proof mass assembly 20. As shown, support structure 24 may be in a form of a planar ring structure that substantially surrounds proof mass 22 and substantially maintains flexures 28 and 38 and proof mass 22 in a common plane (e.g., the x-y plane of FIG. 2). Although support structure 24 as shown in FIG. 2 is a circular shape, it is contemplated that support structure 24 may be any shape (e.g., square, rectangular, oval, or the like) and may or may not surround proof mass 22.

Support structure 24 may be formed using any suitable material. In some examples, support structure 24 may be made of a piezoelectric material, such as quartz (SiO2), Berlinite (AlPO4), gallium orthophosphate (GaPO4), thermaline, barium titanate (BaTiO3), or lead zirconate titanate (PZT), zinc oxide (ZnO), or aluminum nitride (AlN), etc. In other examples, support structure 24 may be made of a silicon material.

In some examples, support structure 24 may also include a plurality of electrical traces 32 and 42. In some examples electrical traces 32 and 42 may be formed on a single surface of support structure 24 (e.g., upper surface) or on multiple surfaces (e.g., upper, lower, and side surfaces) of support structure 24. Electrical traces 32 and 42 may electrically communicate with thin film leads 30 and 40 to transmit an electrical signal. Additionally, in some examples electrical traces 32 and 42 may be electrically connected to upper and lower stators 12 and 14 (e.g., via electrical bonding pads or mounting pads 34 and 44) to establish electrical connections with other components, including additional circuitry, of accelerometer 10 or to other devices in which accelerometer 10 is installed.

Electrical traces 32 and 42 may be formed using any suitable conductive material. In some examples, the composition of electrical traces 32 and 42 may be selected to exhibit good TEC compatibility with the base material of support structure 24 as well as demonstrate relatively low electrical resistivity. For example, electrical traces 32 and 42 may be formed from a layer of chromium plated with a layer of gold. In such examples, the layer of chromium may provide relatively good adhesion to the base material of support structure 24 (e.g., quartz) while the layer of gold provides low electrical resistivity and a sufficient basis for establishing other electrical connections (e.g., wire bonds). In some examples, electrical traces 32 and 42 may be made from the same electrically conductive material as thin film leads 30 and 40.

Electrical traces 32 and 42 may be formed using any suitable technique. For example, portions of support structure 24 may be masked to define electrical traces 32 and 42 followed by deposition of a conductive material using, for example, chemical vapor deposition, physical vapor deposition (e.g., electron beam evaporation or sputtering), or the like.

Support structure 24 may also include one or more mounting pads 34, 44, and 49 positioned at various locations on support structure 24. In some examples, mounting pads 34, 44, and 49 may be raised such that when accelerometer 10 is fully assembled, mounting pads 34, 44, and 49 may contact upper and lower stators 12 and 14 to separate proof mass assembly 20 from upper and lower stators 12 and 14 as well as provide mounting support for proof mass assembly 20. Mounting pads 34, 44, and 49 may take on any form or shape and may be present in any quantity. In some examples, the height of mounting pads 34, 44, and 49 may define the capacitive gaps between upper and lower stators 12 and 14 and the upper and lower capacitance pick-off plates (e.g., upper capacitance pick-off plate 26) on proof mass 22. In some examples, the height of mounting pads 34, 44, and 49 may be between half of one-thousandth to one-thousandth of an inch. In some examples, mounting pads 34, 44, and 49 may be on both sides of support structure 24.

In some examples, mounting pads 34, 44, and 49 may be configured to help relieve forces and/or strains arising from TEC mismatches between upper and lower stators 12 and 14 and support structure 24 of proof mass assembly 20. For example, mounting pads 34, 44, and 49 may be configured to mechanically isolated portions of proof mass assembly 20 from forces and/or strains caused during construction of accelerometer 10 (e.g., through the use of cutaways to mechanically isolate mounting pads 34, 44, and 49 from support structure 24). In some examples, mounting pads 34, 44, and 49 may provide frictional forces to upper and lower stators 12 and 14 and/or help prevent the stators from shifting or slipping during construction or operation of accelerometer 10. In some examples, mounting pads 34, 44, and 49 are made of a piezoelectric material, such as quartz ($SiO_2$), Berlinite ($AlPO_4$), gallium orthophosphate ($GaPO_4$), thermaline, barium titanate ($BaTiO_3$), or lead zirconate titanate (PZT), zinc oxide (ZnO), or aluminum nitride (AlN), etc. In other examples, mounting pads 34, 44, and 49 are made of a silicon material.

Mounting pads 34, 44, and 49 may be configured to electrically connect components and circuitry of proof mass assembly 20 with other components, including additional circuitry, of accelerometer 10. For example, electrical traces 32 and 42 may be deposited on a portion of mounting pads 34 and 44 respectively. When upper and lower stators 12 and 14 are mounted to opposite sides of proof mass assembly 20, electrical traces 32 and 42 may establish an electrical connection with upper and lower stators 12 and 14 through the contact points on mounting pads 34 and 44.

Proof mass assembly 20 also includes proof mass 22, which may include one or more capacitance pick-off plates (e.g., upper capacitance pick-off plate 26) and one or more force-rebalance coils (e.g., upper force-rebalance coil 36) mounted on an upper and/or lower surfaces of proof mass 22. While the disclosure describes the operation of accelerometer in terms of upper capacitance pick-off plate 26 and upper force-rebalance coil 36, such descriptions may equally apply to the use of a lower capacitance pick-off plate and lower force-rebalance coil, combinations of upper and lower capacitance pick-off plates and lower force-rebalance coils. Other means of measuring the deflection of proof mass 22 due to acceleration are also contemplated by this disclosure.

In some examples, upper capacitance pick-off plate 26 and upper force-rebalance coil 36 may be configured to interact with upper stator 12 to measure the acceleration applied to accelerometer 10. For example, during operation as acceleration is applied to accelerometer 10, proof mass 22 may deflect from a null position causing the capacitance gap between upper capacitance pick-off plate 26 and the inwardly facing surface of upper stator 12 to change (e.g., increase or decrease) resulting in a change in a capacitance measurement. In some examples, the change in capacitance may be used to determine the amount of acceleration applied to accelerometer 10. Additionally or alternatively, accelerometer 10 may be configured to apply an electrical current to upper force-rebalancing coil 36 (e.g., through thin film lead 40) based on the change in capacitance such that upper force-rebalancing coil 36 in conjunction with an magnetic pole piece of upper stator 12 acts as a servo to maintain the position proof mass 22 at a null position. In such examples, the current applied to upper force-rebalancing coil 36 to maintain proof mass 22 at the null is proportional to and may be used to determine the amount of acceleration applied to accelerometer 10.

In some examples, upper force-rebalancing coil 36 may be attached to an upper or lower surface of proof mass 22. Upper force-rebalancing coil 36 may be formed, for example, from of a copper coil and attached to one of the respective surfaces of proof mass 22 using suitable techniques. In some examples, upper force-rebalancing coil 36 may include a coil form (e.g., anodized aluminum form) that provides additional support for the coil. In such examples, the coil form may be mounted directly to the surface of proof mass 22 using, for example, a compliant elastomer. The compliant elastomer may help alleviate possible TEC mismatches between the coil form and base materials of proof mass 22.

Upper force-rebalancing coil 36 may be electrically connected to other electronic components of accelerometer 10 through one or more of the thin film leads (e.g., thin film lead 40) on flexures 28 and 38. In some examples, upper force-rebalancing coil 36 may be directly electrically connected (e.g., physically connected) to thin film lead 40. In some examples, upper force-rebalancing coil 36 may be indirectly electrically connected to thin film lead 40 using, for example, an electrical trace 46 or the like to establish the electrical connection across a portion of proof mass 22.

Proof mass 22 also includes upper capacitance pick-off plate 26 formed on the upper surface of proof mass 22. In some examples, upper capacitance pick-off plate 26 may cooperate with the inwardly facing surfaces of upper stator 12 to provide a capacitive pick-off system. Electrical connections to upper capacitance pick-off plate 26 may be established through one or more of the thin film leads (e.g., thin film lead 30) on flexures 28 and 38. In some examples, upper capacitance pick-off plate 26 may be directly electrically connected (e.g., physically connected) to thin film lead 30. In some examples, upper capacitance pick-off plate 26 may be indirectly electrically connected to thin film lead 30 using, for example, an electrical trace (not shown) or the like to establish the electrical connection across a portion of proof mass 22.

Upper capacitance pick-off plate 26 may be formed using any suitable technique. For example, portions of proof mass 22 may be masked to define upper capacitance pick-off plate 26 followed by deposition of a conductive material using, for example, chemical vapor deposition, physical vapor deposition (e.g., electron beam evaporation or sputtering), or the like. In some examples, upper capacitance pick-off plate 26 may include a layer of chromium formed on the surface of proof mass 22 followed by a layer of gold formed on the layer of chromium. In some examples, upper capacitance pick-off plate 26 may be formed simultaneously with electrical traces 32, 42, and 46 using the same conductive materials. In other examples, upper capacitance pick-off plate 26 may be formed separately from electrical traces 32, 42, and 46 using the same or different conductive materials. While, upper capacitance pick-off plate 26 is depicted as a c-shaped capacitor pick-off plate, it is contemplated that upper capacitance pick-off plate 26 may take the form of any suitable shape configured to measure a capacitance with upper stator 12.

Proof mass 22 may be flexibly connected to support structure 24 using one or more flexures 28 and 38. In some examples, flexures 28 and 38 may support proof mass 22 within support structure 24 and enable proof mass 22 to move about the plane defined by support structure 24. For example, flexures 28 and 38 may be stiff in the radial direction of FIG. 2 (e.g., in the x-axis and y-axis directions) and flexible in vertical direction (e.g., in z-axis direction), such that flexures 28 and 38 allow proof mass 22 to move in a direction substantially orthogonal (e.g., orthogonal or nearly orthogonal) to a plane defined by support structure 24 due to acceleration of accelerometer 10.

Flexures 28 and 38 may be formed from any suitable base material. For example, flexures 28 and 38 may be made of a piezoelectric material, such as quartz ($SiO_2$), Berlinite ($AlPO_4$), gallium orthophosphate ($GaPO_4$), thermaline, barium titanate ($BaTiO_3$), or lead zirconate titanate (PZT), zinc oxide (ZnO), or aluminum nitride (AlN), etc. In other examples, flexures 28 and 38 may be made of a silicon material. In some examples, flexures 28 and 38 may be formed using the same base material as support structure 24 and proof mass 22, such that the three components are formed from a monolithic material (e.g., a single structure). For example, proof mass 22, flexures 28 and 38, and support structure 24 may be made from the same silicon material or piezoelectric material (e.g., quartz). In such examples, the plurality of features defining proof mass 22, flexures 28 and 38, and support structure 24 of proof mass assembly 20 may be etched into the monolithic material using, for example, a carbon-dioxide laser or acid bath to define the base features for proof mass assembly 20. For example, in some examples, the base material for proof mass 22, flexures 28 and 38, and support structure 24 may consist essentially of quartz or silicon (e.g., made of primarily of quartz or silicon) in the form a monolithic material. The monolithic material may be covered with a photoresist masking to define the various features of proof mass 22, support structure 24, and flexures 28 and 38 and the monolithic material may be exposed to laser light to remove (e.g., vaporize) excess material and form the various structural features proof mass 22, support structure 24, and flexures 28 and 38. In some examples, the base features of proof mass assembly 20 may be formed from the monolithic material by masking the monolithic material with a silk screen vinyl material or a silicon rubber material followed by submersion of the monolithic material in an acid bath to etch away excess materials.

In some examples, flexures 28 and 38 may be relatively thin (e.g., thin relative to support structure 24 and proof mass 22) in a direction defining the motion of proof mass 22. In some examples, flexures 28 and 38 may define a thickness in a direction substantially orthogonal (e.g., orthogonal or nearly orthogonal) to a plane defined by support structure 24 of about 0.25 to about 1 millimeters.

Flexures 28 and 38 may include one or more thin film leads 30 and 40 configured to transmit electrical signals across flexures 28 and 38 of proof mass assembly 20 and between components on support structure 24 and proof mass 22. In some examples, thin film leads 30 and 40 may be formed on a single surface of a respective flexure of flexures 28 and 38 (e.g., upper surface) or may be formed on multiple surfaces of flexures 28 and 38 (e.g., upper and lower surfaces).

Thin film leads 30 and 40 may act as an electrical bridge electrically connecting components including circuitry positioned on proof mass 22 (e.g., upper capacitance pick-off plate 26) and other components, including additional circuitry, positioned on support structure 24 (e.g., electrical trace 32). For example, as shown in FIG. 2, thin film lead 30 provides an electrical connection across first flexure 28 between electrical trace 46 connected to upper force-rebalance coil 36 on proof mass 22 and electrical trace 42 on a portion of support structure 24. Similarly, thin film lead 40 provides an electrical connection across second flexure 38 between upper capacitance pick-off plate 26 and electrical trace 32 on a portion of support structure 24.

In some examples, thin film leads 30 and 40 may be configured to reduced hysteresis effects of accelerometer 10 by, for example, reducing the TEC mismatches between thin film leads 30 and 40 and the base material used to form flexures 28 and 38. For example, thin film leads 30 and 40 may be formed using an electrically conductive material or materials that demonstrate a greater TEC compatibility compared to pure gold with the underlying base material of flexures 28 and 38 (e.g., TEC less than about 14 ppm/° C.). Suitable conductive materials demonstrating relatively low TECs include, for example, titanium (about 8.6 ppm/° C.), molybdenum (about 4.8 ppm/° C.), tungsten (about 4.5 ppm/° C.), alloy of gold (e.g., mixtures including gold that have a TEC less than pure gold (e.g., less than about 14 ppm/° C.)), graphene (about 0.8 ppm/° C.), hafnium (about 5.9 ppm/° C.), zirconium (about 5.7 ppm /° C.), or the like.

Additionally or alternatively, thin film leads 30 and 40 may be configured to reduced hysteresis effects of accelerometer 10 by, for example, forming thin film leads 30 and 40 using an electrically conductive material or materials that demonstrate a relatively high yield strengths (e.g., greater than that of pure gold (approximately 80 MPa)). Forming thin film leads 30 and 40 using relatively high yield strength materials may allow the leads to possess greater elasticity and resistance to permanent deformation arising during routine movement of flexures 28 and 38, thereby allowing proof mass 22 to return to the null position. Suitable materials demonstrating relatively high yield strengths include, for example, titanium (about 160 MPa), molybdenum (about 170 MPa), tungsten (about 585 MPa), alloy of gold (e.g., a mixture including gold and about 8% titanium) having yield strengths greater than pure gold (e.g., greater than about 80 MPa), graphene (about 1 TPa), or the like.

Additionally or alternatively, the hysteresis effects produced by thin film leads 30 and 40 may be improved by selecting an electrically conductive material or materials that demonstrate relatively low electrical resistivity (e.g., less than electrical resistivity of pure gold). By keeping the electrical resistivity of thin film leads 30 and 40 relatively low, less heat may be generated by the passage of electrical current through thin film leads 30 and 40, thereby reducing the temperature differences exerted between thin film leads 30 and 40 and the base material of flexures 28 and 38. Additionally, reducing the heat generated in accelerometer 10 may prevent undesired temperature swings throughout the device, thereby reducing the effects attributed to TEC mismatches.

Additionally or alternatively, thin film leads 30 and 40 may be configured to reduce hysteresis effects of accelerometer 10 by, for example, reducing the relative thickness of the thin film leads 30 and 40 deposited on flexures 28 and 38 (e.g., thickness as measured in the z-axis direction of FIG. 2). For example, pure gold, while demonstrating low electrical resistivity, poorly adheres to quartz or silicon and may require an initial adhesion layer of material (e.g., chromium) to be deposited on the quartz or silicon prior to depositing the layer of gold. The formation of multiple layers of conductive materials across flexures 28 and 38 may, in some examples, be undesirable. By selecting a conductive material or materials that demonstrates good adhesion with the base material of flexures 28 and 38, such as the conductive materials described above, thin film leads 30 and 40 may be formed using a single layer of conductive materials, or may permit thin film leads 30 and 40 to remain relatively thin compared to a multi-layer lead of chromium and gold. Example materials that may demonstrate good adhesion to the underlying base material of the flexure include, for example, an alloy of gold (e.g., a mixture including gold and about 8% titanium) having improved adhesion compared to pure gold, titanium, aluminum-titanium alloy, graphene, molybdenum, tungsten, hafnium, or zirconium.

In some examples, the relative thickness of thin film leads 30 and 40 deposited on flexures 28 and 38 may be reduced by reducing the amount of gold applied across flexures 28 and 38. For example, the amount or thickness of the layer of gold needed to establish an electrical signals across flexures 28 and 38 may be less than the amount of gold needed to form other electrical connections (e.g., wire bonding) or components (e.g., upper capacitance pick-off plate 26 and/or electrical traces 32, 42, and 46). In such examples, thin film leads 30 and 40 may be formed using a thin layer of gold having a thickness of between about 500 and about 700 angstroms. In some examples the thin layer of gold may be about 20% of the relative thickness of gold used to form electrical traces 32, 42, and 46. In some examples, the thin layer of gold may be deposited on a layer of chromium to form thin film leads 30 and 40.

Additionally or alternatively, in some examples the hysteresis effects produced by thin film leads 30 and 40 may be improved by forming the thin film leads 30 and 40 with an electrically conductive materials that includes an aluminum-titanium alloy (e.g., a mixture including aluminum and titanium). In such examples, the inclusion of titanium may modify the grain boundaries of the aluminum to reduce the hysteresis effect of the thin film leads 30 and 40. In some examples, the aluminum-titanium alloy may include mostly aluminum and less than about 2% titanium, in some examples less than about 1% titanium, in some examples about 0.5% titanium. In some examples, the aluminum-titanium alloy may include about 0.5% titanium.

In some examples, improvement to the hysteresis effects caused by thin film leads 30 and 40 may be obtained by formulating thin film leads 30 and 40 to include conductive materials such as a thin layer of gold having a thickness of between about 500 and about 700 angstroms, an alloy of gold, titanium, aluminum-titanium alloy, graphene, molybdenum, tungsten, hafnium, or zirconium, or combinations thereof. In some examples, improvement to the hysteresis effects caused by thin film leads 30 and 40 may be obtained by formulating thin film leads 30 and 40 to consist essentially of an alloy of gold, titanium, aluminum-titanium alloy, graphene, molybdenum, tungsten, hafnium, zirconium, or combinations thereof. For example, thin film leads 30 and 40 may be formulated to consist of only an alloy of gold, titanium, aluminum-titanium alloy, graphene, molybdenum, tungsten, hafnium, zirconium, or a combination thereof, or may be formulated such that some impurities may be present in the formulation.

Figure 3:
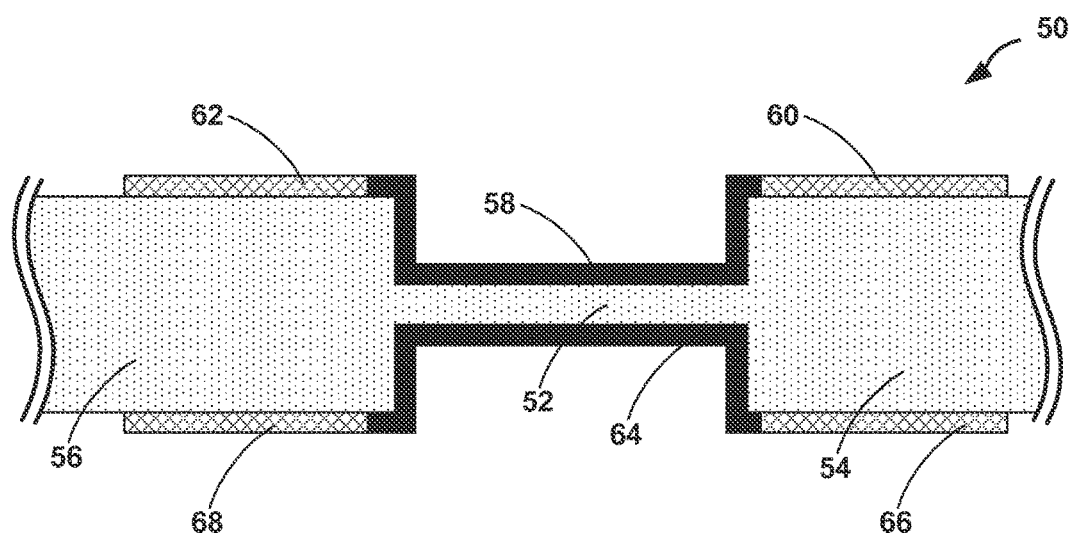
FIG. 3 is a conceptual cross-sectional view of a portion of an example proof mass assembly including a flexure connecting a support structure to a proof mass.

In some examples, thin film leads 30 and 40 may extend over portions of support structure 24 and proof mass 22 to establish the appropriate electrical connections with the respective components or circuitry of accelerometer 10. For example, FIG. 3 shows a conceptual cross-sectional view of a portion of an example proof mass assembly 50 including a flexure 52 connecting a support structure 56 to a proof mass 54. Support structure 56 may include electrical traces 62 and 68 on the upper and lower surfaces of support structure 56 respectively. Similarly proof mass 54 may include electrical traces 60 and 66 on the upper and lower surfaces of proof mass 54 respectively. As shown, the upper and lower surfaces of flexure 52 include thin film leads 58 and 64 respectively. Thin film leads 58 and 64 extend across flexure 52 and portions of support structure 56 and proof mass 54 to establish electrical connections with respective electrical traces 60, 62, 66, and 68. In such examples, extending thin film leads 58 and 64 across portions of support structure 56 and proof mass 54 may help reduce hysteresis effects that may otherwise arise on flexure 52 due to the interactions between thin film leads 58 and 64 and respective electrical traces 60, 62, 66, and 68 during operation.

Figure 4:
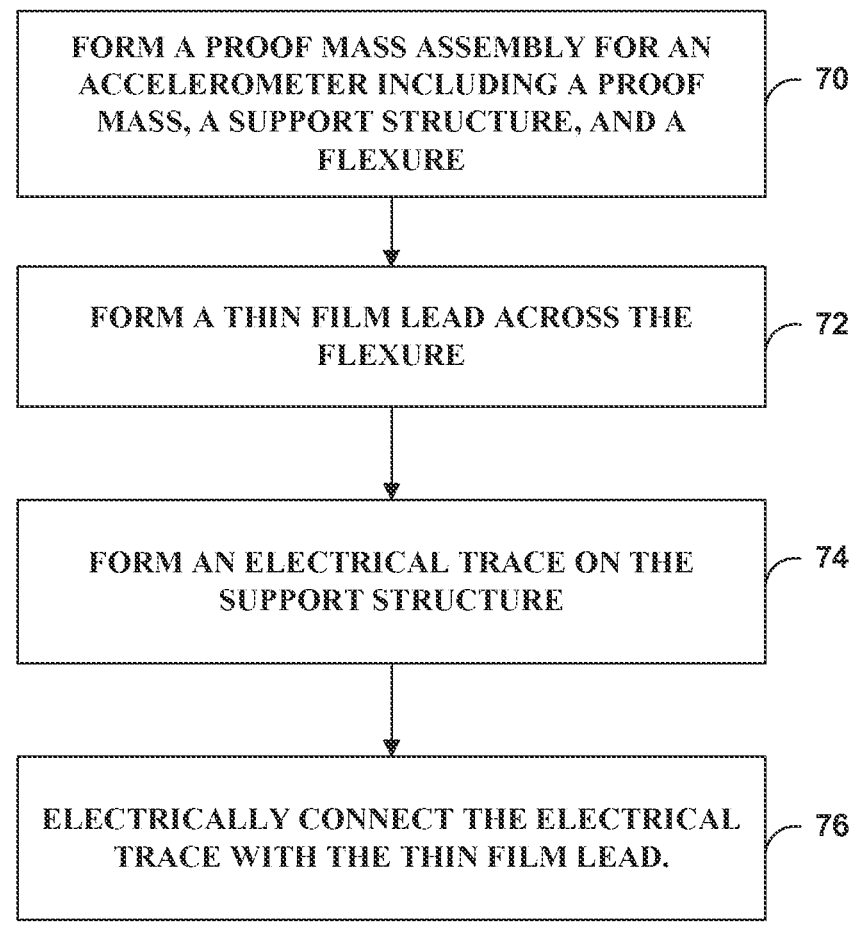
FIG. 4 is a flow chart illustrating an example technique for making an accelerometer in accordance with the disclosure.

Accelerometer 10 may be formed using any suitable technique. FIG. 4 is a flow diagram illustrating an example technique for forming an example accelerometer in accordance with the disclosure, such as, for example accelerometer 10. While the technique shown in FIG. 4 is described with respect to accelerometer 10, in other examples, the techniques may be used to form other accelerometers or portions of accelerometers that include different configurations or the accelerometers or portions of accelerometers described herein may be form using other techniques.

The technique illustrated in FIG. 4 includes forming proof mass assembly 20 for accelerometer 10 including support structure 24 flexibly connected to proof mass 22 by at least one flexure of flexures 28 and 38 (70). Proof mass assembly 20 may be formed using any one or more of the techniques described above including, for example, forming proof mass 22, support structure 24, and flexures 28 and 38 from of proof mass assembly 20 from a monolithic material using a mask/etching process.

The technique illustrated in FIG. 4 also includes forming a thin film lead (e.g., thin film leads 30 and 40) across at least one of flexures 28 and 38 (72). Thin film leads 30 and 40 may establish an electrical connection across flexure 28 and 38 between an electrical component on support structure 24 (e.g., electrical traces 32 and 42 or other circuitry) and an electrical component on proof mass 22 (e.g., upper capacitance pick-off plate 26 or upper force rebalancing coil 36).

As described above, thin film leads 30 and 40 may reduce the hysteresis effects of accelerometer 10 by possessing a yield strength greater than pure gold or additionally or alternatively a thermal expansion coefficient less than that of pure gold. In some examples, improvement to the hysteresis effects caused by thin film leads 30 and 40 may be obtained by formulating thin film leads 30 and 40 to include conductive materials such as titanium, aluminum-titanium alloy, molybdenum, tungsten, graphene, alloys of gold, or combinations thereof. In some examples, improvement to the hysteresis effects caused by thin film leads 30 and 40 may be obtained by formulating thin film leads 30 and 40 to consist essentially of titanium, aluminum-titanium alloy, molybdenum, tungsten, graphene, alloys of gold, or combinations thereof.

In some techniques, thin film leads 30 and 40 may be formed across at least one of flexures 28 and 38 (72) by depositing a conductive material on a portion of flexures 28 and 38 using, for example, chemical vapor deposition or physical vapor deposition.

The technique illustrated in FIG. 4 may also include forming one or more electrical traces 32 and 42 on support structure 24 (74) and electrically connecting electrical traces 32 and 42 to respective thin film leads 30 and 40 (76). Electrical traces 32 and 42 and thin film leads 30 and 40 may be formed in any order and electrically connected using any suitable means. For example, electrical traces 32 and 42 may be initially formed (74) by masking portions of support structure 24 and depositing one or more layers of a conductive material (e.g., layer of gold on a layer of chromium) to form electrical traces 32 and 42. Proof mass assembly 20 may then be re-masked to define thin film leads 30 and 40 across flexures 28 and 38 and onto portions of support structure 24 such that thin film leads 30 and 40 will abut or overlap electrical traces 32 and 42. The conductive material used to form thin film leads 30 and 40 may then be deposited on the respective portions of proof mass assembly 20, thereby forming the respective leads (72) as well as electrically connecting thin film leads 30 and 40 to electrical traces 32 and 42 in the process.

In some examples, the techniques described with respect to FIG. 4 may be implemented using hardware, software, firmware, any combination thereof, or other suitable devices. For example, if implemented using software, the techniques used to form the various features of accelerometer 10 may be programmed and stored on or transmitted over, as one or more instructions or code, a computer-readable medium and executed by a hardware-based processing units configured to perform the various techniques described above. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium. By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer.

Instructions to perform the various techniques described above may be executed in some examples by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. The techniques of this disclosure also may be implemented in a wide variety of other suitable devices or apparatuses.

Various examples of the disclosure have been described. These and other examples are within the scope of the following claims.

What is claimed is:

1. An accelerometer comprising:
upper and lower stators, wherein at least one of the upper and lower stators comprises a permanent magnet; and
a proof mass assembly deposited between the upper and lower stators, the proof mass assembly comprising:
   a proof mass;
   a support structure;
   a flexure flexibly connecting the proof mass to the support structure, wherein the flexure allows the proof mass to move about a plane defined by the support structure;
   at least one thin film lead comprising an electrically conductive material on the flexure, wherein the at least one thin film lead provides an electrical connection between an electrical component on the support structure and an electrical component on the proof mass, and wherein the at least one thin film lead comprises at least one of a yield strength greater than pure gold or a thermal expansion coefficient less than pure gold; and
   a force-rebalance coil attached to the proof mass configured to communicate with the permanent magnet to maintain the proof mass at a null position, wherein the force-rebalance coil electrically communicates with the at least one thin film lead.

2. The accelerometer of claim 1, wherein the at least one thin film lead comprises at least one of titanium, graphene, molybdenum, tungsten, hafnium, zirconium, or an alloy of gold.

3. The accelerometer of claim 1, wherein the at least one thin film lead consists essentially of at least one of titanium, graphene, molybdenum, hafnium, zirconium, tungsten, or an alloy of gold.

4. The accelerometer of claim 1, wherein the proof mass, the support structure, and the flexure are formed from a monolithic material.

5. The accelerometer of claim 1, wherein the flexure comprise quartz or silicon.

6. The accelerometer of claim 1, further comprising an electrical trace on the support structure, wherein the electrical trace electrically connects to the at least one thin film lead, and wherein the electrical trace comprises a layer of gold on a layer of chromium.

7. The accelerometer of claim 1, wherein the proof mass assembly further comprises:
a capacitance pick-off plate on a surface of the proof mass configured to measure an acceleration of the accelerometer, wherein the capacitance pick-off plate electrically communicates with the at least one thin film lead.

8. The accelerometer of claim 1, wherein the at least one thin film lead comprises graphene.

9. An accelerometer comprising:
upper and lower stators, wherein at least one of the upper and lower stators comprises a permanent magnet; and
a proof mass assembly deposited between the upper and lower stators, wherein the proof mass assembly comprises:
   a proof mass;
   a support structure attached to the upper and lower stators;
   a flexure flexibly connecting the proof mass to the support structure, wherein the flexure allows the proof mass to move about a plane defined by the support structure;
   at least one thin film lead comprising an electrically conductive material on the flexure, wherein the at least one thin film lead provides an electrical connection between an electrical component on the support structure and an electrical component on the proof mass, and wherein the at least one thin film lead comprises at least one of a thin layer of gold having a thickness of between about 500 and about 700 angstroms, an alloy of gold, titanium, aluminum-titanium alloy, graphene, molybdenum, tungsten, hafnium, or zirconium; and
   a force-rebalance coil attached to a surface of the proof mass configured to communicate with the permanent magnet to maintain the proof mass at a null position, wherein the force-rebalance coil electrically communicates with the at least one thin film lead.

10. The accelerometer of claim 9, further comprising:
a capacitance pick-off plate on a surface of the proof mass configured to measure an acceleration of the accelerometer, wherein the capacitance pick-off plate electrically communicates with the at least one thin film lead.

11. The accelerometer of claim 9, wherein the at least one thin film lead consists essentially of at least one of titanium, aluminum-titanium alloy, graphene, molybdenum, tungsten, hafnium, zirconium, or an alloy of gold.

12. The accelerometer of claim 9, further comprising an electrical trace on the support structure, wherein the electrical trace electrically connects to the at least one thin film lead to at least one of the upper and lower stators, and wherein the electrical trace comprises a layer of gold on a layer of chromium.

13. The accelerometer of claim 9, wherein the at least one thin film lead comprises graphene.

14. A method comprising:
forming a proof mass assembly for an accelerometer, wherein the proof mass assembly comprises a support structure flexibly connected to a proof mass by at least one flexure; wherein forming the proof mass assembly comprises:
   forming a thin film lead on a surface of the at least one flexure, wherein the thin film lead comprises at least one of a yield strength greater than pure gold or a thermal expansion coefficient less than pure gold, and wherein the thin film lead establishes an electrical connection across the flexure between an electrical component on the support structure and an electrical component on the proof mass;
   mounting a force-rebalance coil to a major surface of the proof mass, wherein the force-rebalance coil electrically communicates with the thin film lead; and
mounting the proof mass assembly between upper and lower stators, wherein at least one of the upper and lower stators comprises a permanent magnet, wherein the force-rebalance coil is configured to communicate with the permanent magnet to maintain the proof mass at a null position.

15. The method of claim 14, wherein the thin film lead comprises at least one of titanium, graphene, molybdenum, tungsten, hafnium, zirconium, or an alloy of gold.

16. The method of claim 14, wherein the thin film lead consists essentially of at least one of titanium, graphene, molybdenum, hafnium, zirconium, tungsten, or an alloy of gold.

17. The method of claim 14, wherein forming the proof mass assembly further comprises:
   forming the proof mass, the support structure, and the flexure of the proof mass assembly from a monolithic material comprising at least one of quartz or silicon.

18. The method of claim 14, wherein forming the proof mass assembly further comprises:
   forming an electrical trace on the support structure, wherein the electrical trace comprises a layer of gold on a layer of chromium; and
   electrically connecting the electrical trace and the thin film lead.

19. The method of claim 14, wherein forming a thin film lead on a surface of the at least one flexure comprises depositing a conductive material on a portion of the flexure using chemical vapor deposition or physical vapor deposition.

20. The method of claim 14, wherein the thin film lead comprises graphene.

\* \* \* \* \*